US008063404B2

(12) United States Patent
Renn

(10) Patent No.: US 8,063,404 B2
(45) Date of Patent: Nov. 22, 2011

(54) SEMICONDUCTOR MEMORY DEVICE

(75) Inventor: Shing-Hwa Renn, Taipei (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 118 days.

(21) Appl. No.: 12/750,710

(22) Filed: Mar. 31, 2010

(65) Prior Publication Data

US 2011/0241105 A1 Oct. 6, 2011

(51) Int. Cl.
*H01L 27/108* (2006.01)

(52) U.S. Cl. ............ 257/68; 257/71; 257/330; 257/300; 257/301; 257/302; 257/303; 257/304; 257/305; 257/60; 257/328; 257/334

(58) Field of Classification Search .............. 257/68, 257/71, 296–313, 60, 328–334
See application file for complete search history.

(56) References Cited

U.S. PATENT DOCUMENTS

| 5,177,576 | A | * | 1/1993 | Kimura et al. .................. 257/71 |
| 6,284,593 | B1 | * | 9/2001 | Mandelman et al. ......... 438/248 |
| 6,441,422 | B1 | * | 8/2002 | Mandelman et al. ......... 257/300 |
| 6,759,702 | B2 | * | 7/2004 | Radens et al. ................. 257/302 |
| 6,906,372 | B2 | * | 6/2005 | Yamada et al. ................ 257/301 |
| 7,365,384 | B2 | * | 4/2008 | Tran et al. ..................... 257/296 |
| 2004/0046201 | A1 | * | 3/2004 | Noble ........................... 257/301 |

* cited by examiner

*Primary Examiner* — Wai Sing Louie
*Assistant Examiner* — Bilkis Jahan
(74) *Attorney, Agent, or Firm* — Winston Hsu; Scott Margo

(57) ABSTRACT

A semiconductor memory device positioned on an SOI substrate. A semiconductor memory device includes two transistors with three terminals which serve as a source, a reading drain and a writing drain, respectively. The writing drain is heavily-doped for high writing efficiency. A floating body region for storing charges is also heavily-doped to reach long data retention time.

20 Claims, 4 Drawing Sheets

SEMICONDUCTOR MEMORY DEVICE

BACKGROUND OF THE INVENTION

1. Field of the Invention

The present application generally relates to a memory cell and, more particularly, to a capacitor-less dynamic random access memory (DRAM) cells.

2. Description of the Prior Art

A known dynamic random access memory (DRAM) cell includes a transistor and a capacitor. The transistor functions as a switch controlling whether a data is being written into, read from, or held in the DRAM cell. The capacitor functions as the storage device. This one-transistor/one-capacitor (1T/1C) structure limits the extent to which the DRAM cell can be miniaturized and hence the memory capacity of the DRAM device given a certain physical size. The increasing need for smaller electronic systems and larger memory capacity, among other reasons, requires reduction in size of the physical structures inside a memory device.

Therefore, a capacitor-less DRAM cell has been made to further reduce the size of the DRAM cell. A capacitor-less DRAM includes a metal-oxide semiconductor field-effect transistor (MOSFET) on a silicon-on-insulator (SOI) wafer. This new memory cell uses a floating body of a MOSFET on silicon-on-insulator as a storage node. Therefore, the capacitor-less DRAM cell may not need a complicated storage capacitor, which means that the capacitor-less DRAM cell may have a smaller size than that of the 1T/1C DRAM cell. However, it may be desirable to provide good memory data retention and prevent junction leakage for the capacitor-less DRAM cell.

SUMMARY OF THE INVENTION

According to one aspect of the present invention, a semiconductor memory device comprising: a substrate including a supporting insulating region and a semiconductor region disposed on the supporting insulating region, a first isolating element and a second isolating element substantially parallel to the first isolating element embedded in the semiconductor region respectively, a carrier region disposed in the semiconductor region and between the first isolating element and the second isolating element, two source/drain regions positioned in the carrier region with a first isolating layer therebetween, a floating body region positioned underneath the two source/drain regions, an abrupt doping region positioned in the floating body region, a first gate dielectric layer positioned on a first side of the carrier region, a first gate positioned on the first gate dielectric layer, a first conductive line positioned below the first isolating element, and coupling to the abrupt doping region and a second isolating layer extending from the first isolating element and the second isolating element to the supporting insulating region for isolating the floating body region.

According to another aspect of the present invention, a semiconductor memory device comprising: a substrate including a supporting insulating region and a semiconductor region disposed on the supporting insulating region, a plurality of isolations embedded in the semiconductor region and defining a plurality of active areas, wherein at least one of the active area comprises: a first isolating element and a second isolating element substantially parallel to the first isolating element embedded in the semiconductor region in the at least one active area, a carrier region disposed in the semiconductor region in the at least one active area and between the first isolating element and the second isolating element, a dual-transistor memory cell disposed in the at least one active area, the dual-transistor memory cell comprising: a recess-channel transistor comprising a source disposed in a main surface of the carrier region, a reading drain in the main surface of the carrier region being spaced apart from the source, a first isolating layer between the source and the reading drain, and a U-shaped channel at the bottom of the first isolating layer between the source and the reading drain, and a vertical transistor comprising the source disposed in the main surface of the carrier region, a writing drain disposed in the carrier region underneath the source, and a vertical channel between the source and the writing drain, a first gate disposed at a first side of the carrier region, a first gate dielectric layer between the first gate and the carrier region, a second gate disposed at a second side of the carrier region, a second gate dielectric layer between the second gate and the carrier region, a first conductive line positioned below the first isolating element, and coupling to the writing drain, and a second isolating layer extending from the first isolating element and the second isolating element to the supporting insulating region.

According to another aspect of the present invention, a semiconductor memory device comprising: a substrate including supporting insulating region and a semiconductor region disposed on the supporting insulating region, a first trench and a second trench located in the semiconductor region and the supporting insulating region respectively, two source/drain regions located in the semiconductor region between the first trench and the second trench, a first isolating layer located on the surface of the first trench, a first conductive line located on the first isolating layer, wherein a portion of the first conductive line contacts the semiconductor region, an abrupt doping region located in the semiconductor region and adjacent to the first conductive line, a first gate dielectric layer located on a first side of the semiconductor region, a first gate located on the first gate dielectric layer and a second isolating layer located on the surface of the second trench.

The feature of the exemplary embodiments of present invention are that the capacitor-less DRAM cell has three terminals which serve as a source, a reading drain, a writing drain respectively. Especially, the writing drain is heavily-doped and be disposed in a heavily-doped floating body region. Therefore, high impact ionization can be induced during the writing process, and the writing efficiency can be increased. Furthermore, the heavily-doped floating body region can provide longer data retention of the capacitor-less DRAM cell.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
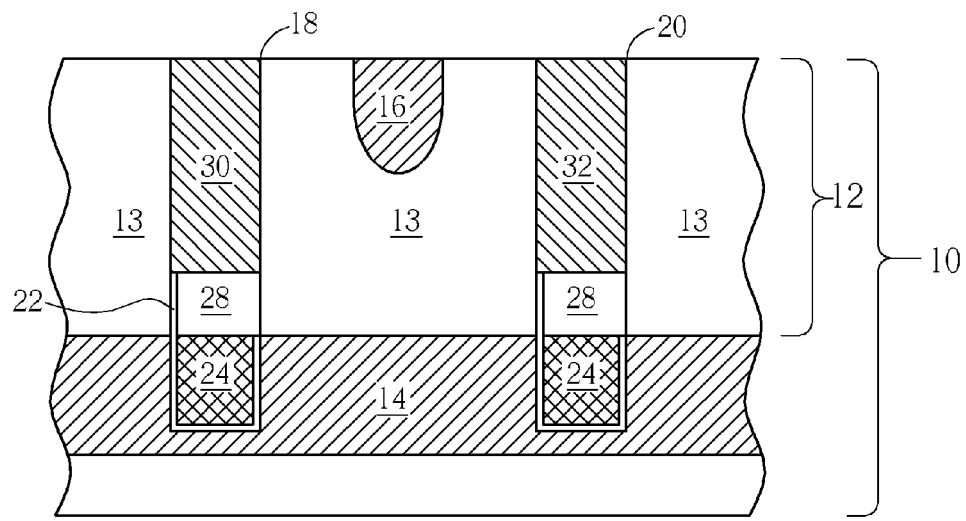
Figure 5:
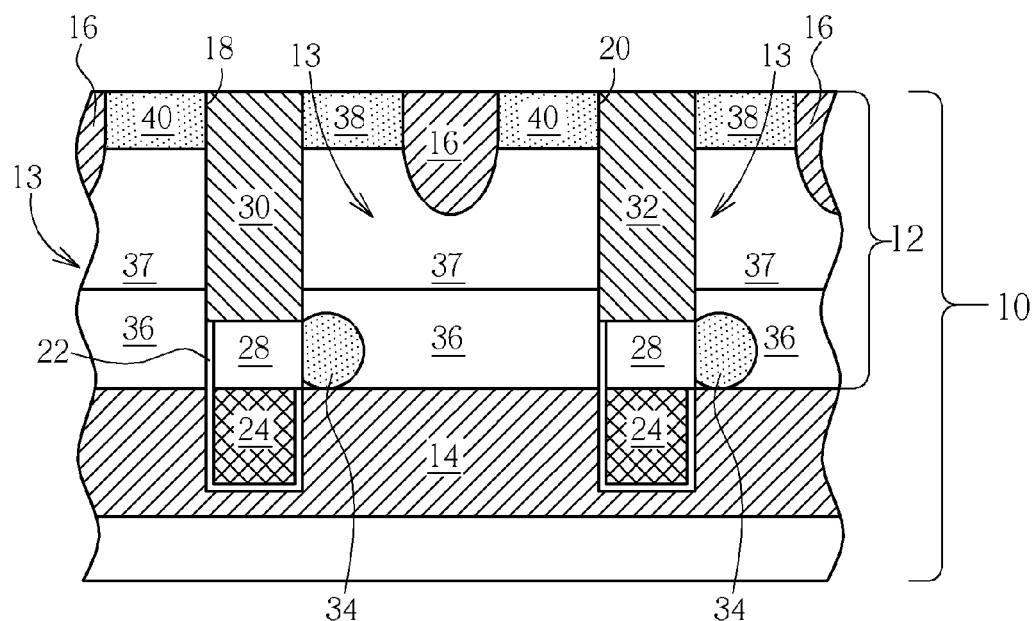
Figure 6:
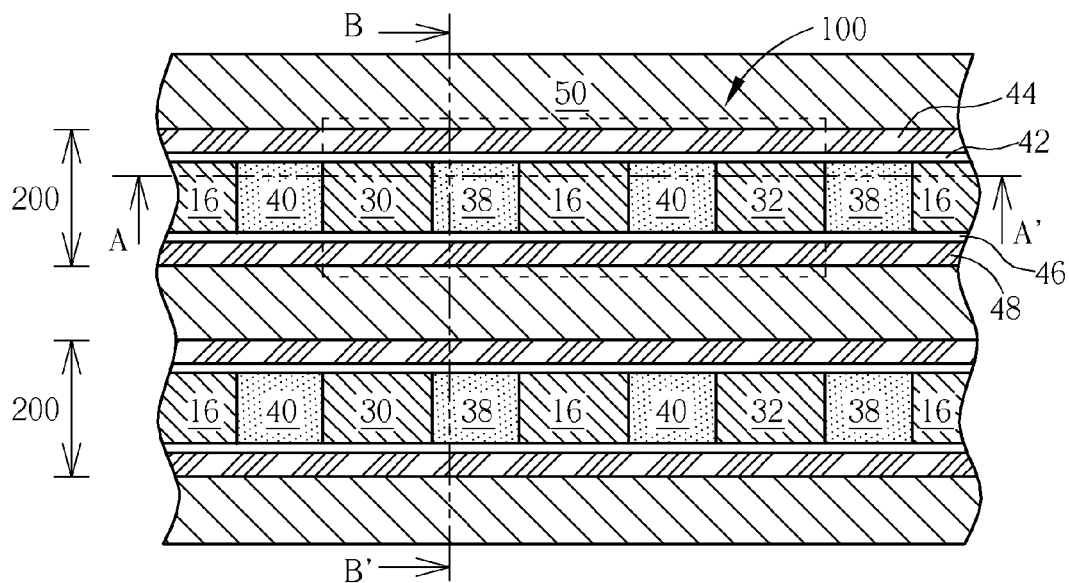
Figure 7:
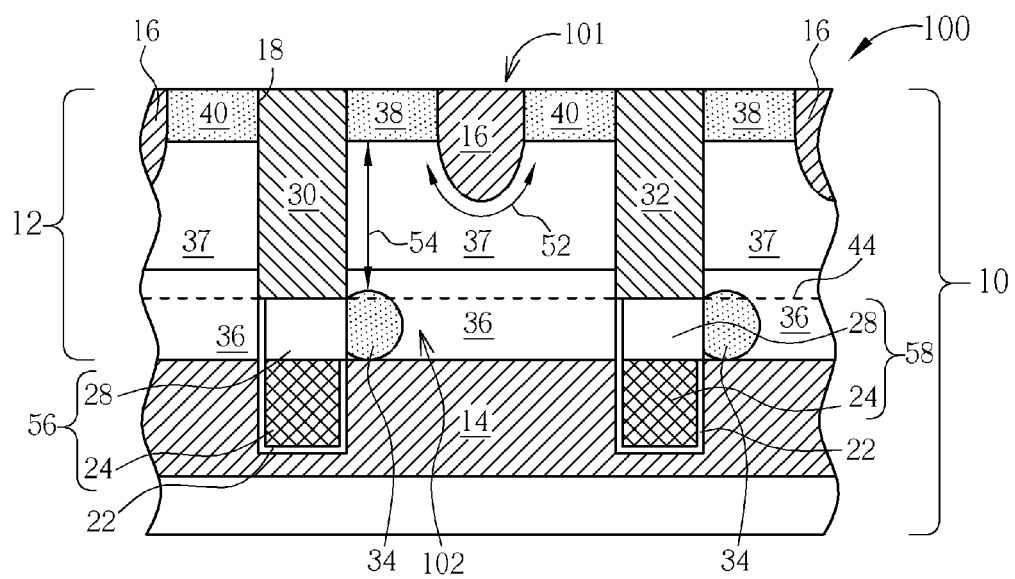
Figure 8:
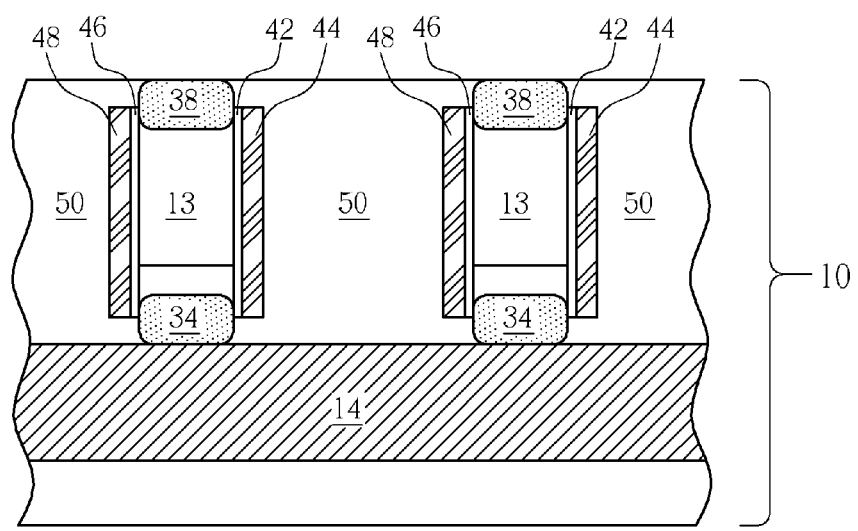

FIG. 1 to FIG. 8 depicts schematically an exemplary method of fabricating semiconductor memory device according to a preferred embodiment of the present invention. FIG. 6 is a top view of the layout of the simplified semiconductor memory device. FIG. 7 is the sectional view of FIG. 6 taken along line AA'. FIG. 8 is the sectional of FIG. 8 taken along line BB'. FIG. 6-8 also depicts schematically an exemplary semiconductor memory device.

Figure 1:
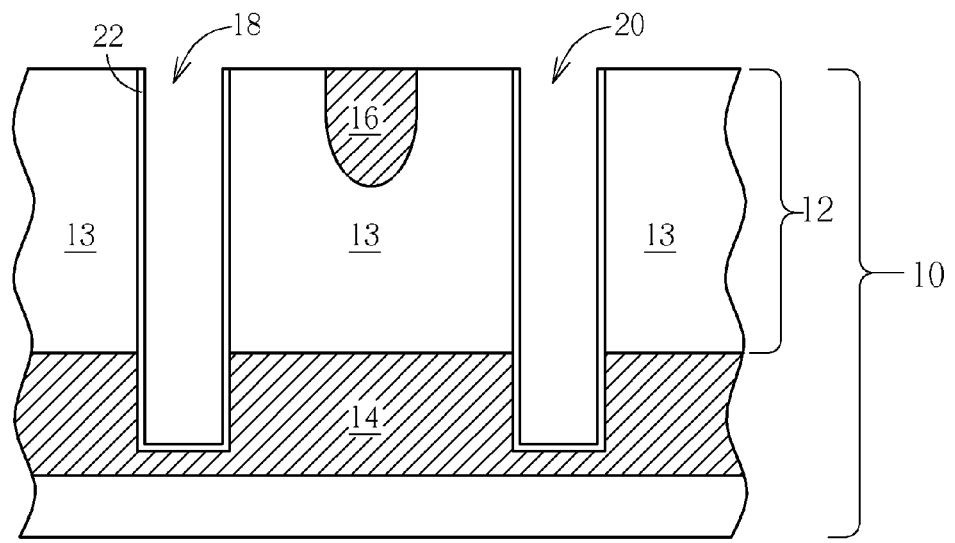
FIG. 1 to FIG. 8 depicts schematically a method of fabricating semiconductor memory device according to a preferred embodiment of the present invention.

Referring to FIG. 1, first, a substrate 10 such as a silicon on insulator substrate is provided. The substrate 10 has a semiconductor region 12 disposed on a supporting insulating region 14. First, an isolating layer 16 is embedded in the semiconductor region 12. Next, two trenches 18, 20 extending from the main surface of the semiconductor region 12 to the supporting insulating region 14 are formed, and the trenches 18, 20 define a carrier region 13 in the semiconductor region 12 and between the trenches 18, 20. Later, an isolating layer 22 such as silicon nitride is formed on the side wall of each of the trenches 18, 20.

Figure 2:
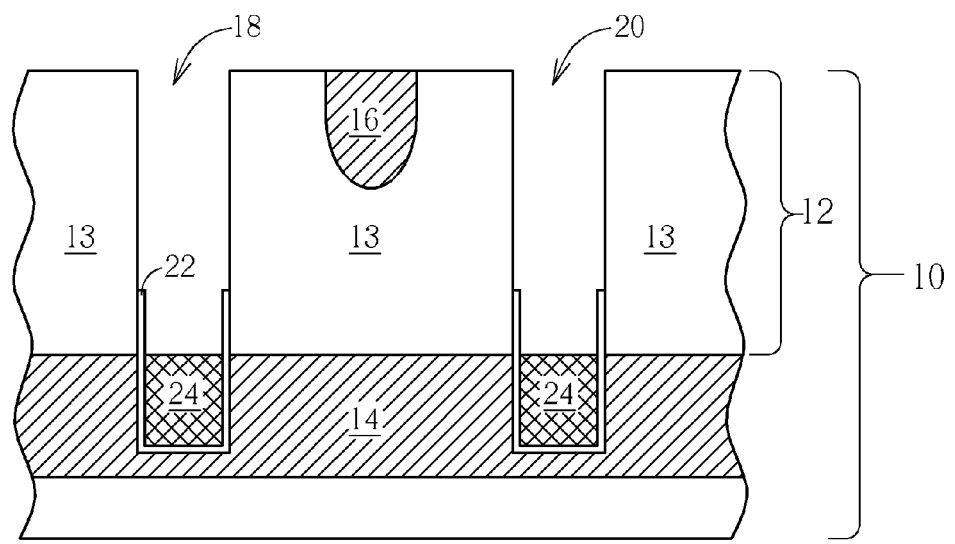
Figure 3:
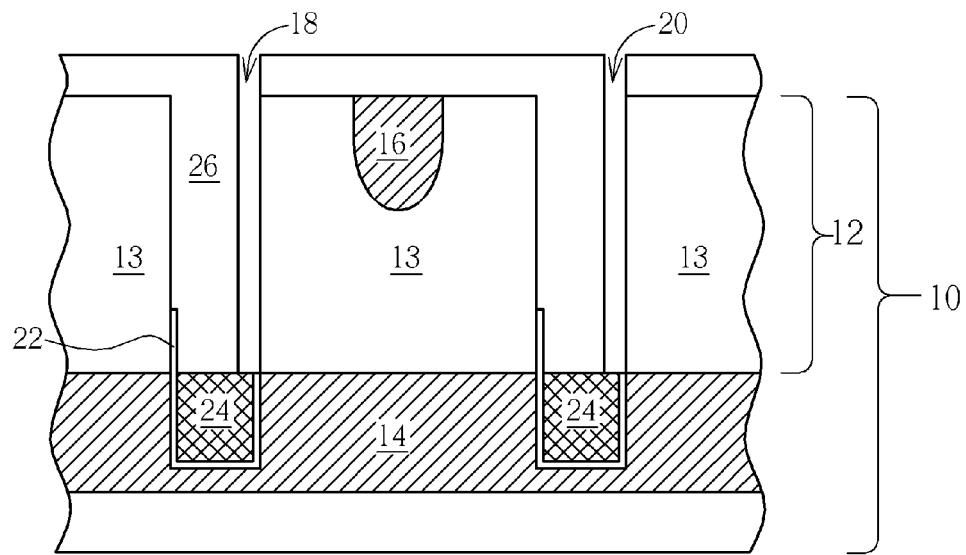

As shown in FIG. 2, a metal layer 24 is formed at the bottom of each of the trenches 18, 20, respectively. Then, the isolating layer 22 at a top portion of the trenches 18, 20 is removed. As shown in FIG. 3, a patterned mask 26 is formed to fill up a part of the trenches 18, 20. One side wall of the trenches 18, 20 is exposed, respectively. After that, the isolating layer 22 above the metal layer 24 on the side wall of the trenches 18, 20 is removed.

As shown in FIG. 4, the patterned mask 26 is removed. Then, a doped polysilicon layer 28 is formed in each of the trenches 18, 20. The doped polysilicon layer 28 is disposed on the metal layer 28 and is only at lower portion of the trenches 18, 20. Subsequently, a first isolating element 30, and a second isolating element 32 fill up the trenches 18, 20 respectively. The first and second isolating element 30, 32 can be silicon oxide.

As shown in FIG. 5, a thermal process, such as an anneal process is performed to diffuse the dopants in the polysilicon layer 28 in the trench 18 into the carrier region 13 to form an abrupt doping region 34. The abrupt doping region 34 can serve as a writing drain 34 during the operation of the capacitor-less DRAM cell. During the anneal process, the dopants in the polysilicon layer 28 in the trench 20 also diffuses into another carrier region 13 resided at the right side of the trench 20 to form another abrupt doping region 34. The abrupt doping region 34 at the right side of the trench 20 may serve as a writing drain for another capacitor-less DRAM cell.

Then, an implantation process is preformed to heavily dope a bulk region at the bottom of the carrier region 13. This bulk region will serve as a floating body region 36 afterwards. Then, the upper part of the carrier region is optionally lightly-doped to form a light doping region 37. The concentration of dopants in the floating body region 36 is 10 times greater than that of the lightly-doped region 37. Next, another implantation process is performed to formed source/drain regions 38, 40 in the carrier region 13. The source/drain regions 38, 40 may serve as a source 38 and a reading drain 40, respectively during the operation of the capacitor-less DRAM cell. The difference of the dopants concentration between the source/drains 38, 40 and the writing drain 34 is above 10 times.

Referring to FIGS. 6, 7 and 8, a first gate dielectric layer 42 is formed on a first side of the carrier region 13. Next, a first gate 44 is formed on the first gate dielectric layer 42. Alternatively, a second gate dielectric layer 46 can be formed optionally on a second side of the carrier region 13 during the formation of the first gate dielectric layer 42. Later, a second gate 48 can be formed optionally on the second gate dielectric layer 46 when the first gate 44 is formed. At this point, the semiconductor memory device of the preferred embodiment of the present invention is completed.

As set forth in the FIGS. 6, 7 and 8, a semiconductor memory device such as a capacitor-less DRAM cell is provided. The capacitor-less DRAM cell is disposed on a silicon on insulator substrate 10 having a semiconductor region 12 disposed on a supporting insulating region 14. The semiconductor region 12 can be silicon layer and the supporting insulating region 14 can be silicon oxide. A plurality of isolations 50 are embedded in the semiconductor region 12 and define a plurality of active areas 200 in the semiconductor region 12. At least one of the active areas 200 includes a first isolating element 30 and a second isolating element 32 substantially parallel to the first isolating element 30, both of the isolating element 30 and the second isolating element 32 are embedded in the semiconductor region 12 in the at least one active area 200. A carrier region 13 disposed in the semiconductor region 12 in the active area 200 and between the first isolating element 30 and the second isolating element 32.

The capacitor-less DRAM cell includes two transistors: a recess channel transistor 101 and a vertical transistor 102, both are disposed in the at least one active area 200.

The recess channel transistor 101 includes source/drain regions 38, 40 disposed in the main surface of the carrier region 13 with an isolating layer 16 between the source/drain regions 38, 40. One of the source/drain regions 38, 40 serves as a source 38, and the other of the source/drain regions 38, 40 serves as a reading drain 40 during the operation of the capacitor-less DRAM cell. The source 38 and the reading drain 40 are of a second conductivity, preferably N type. A U-shaped channel 52 is disposed at the bottom of the isolating layer 16 and couples the source 38 and the reading drain 40.

A floating body region 36 for charge storage is disposed at lower part of the carrier region 13, and beneath the source/drain regions 38, 40. A lightly-doped region 37 is disposed at upper part of the carrier region 13. The floating body region 36 is heavily-doped, and the concentration of dopants in the floating body region 36 is 10 times greater than that of the lightly-doped region 37. The floating body region 36 is of a first conductively, preferably P type.

The vertical transistor 102 includes the source 38, and an abrupt doping region 34 in the carrier region 13 underneath the source 38. More specifically, the abrupt doping region 34 is disposed in the floating body region 36. The abrupt doping region 34 serves as a writing drain 34 during the operation of the capacitor-less DRAM cell. Another abrupt doping region 34 deposed at right side of the second isolating element 32 may serve as another writing drain for another capacitor-less DRAM cell. The writing drain 34 is also of the second conductivity, preferably N type. A vertical channel 54 couples the source 38 and the writing drain 34. The difference of the dopants concentration between the source 38 and the reading drain 40 is above 10 times. According to a preferred embodiment of the present invention, the concentration of dopants in the source 38, and the reading drain 40 is preferably smaller than $10E19$ atom/cm$^3$. The concentration of dopants in the writing drain 34 is preferably greater than $10E19$ atom/cm$^3$.

The recess channel transistor 101, and the vertical transistor 102 shares a first gate 44 disposed on a first side of the carrier region 13. A first gate dielectric layer 42 is disposed between the first gate 44 and the carrier region 13. A second gate 48 can be disposed optionally on a second side of the carrier region 13. A second gate dielectric layer 46 is disposed between the second gate 48 and the carrier region 13.

When a writing process is performed, a current flows in a direction from the U-shaped channel 52 to the vertical channel 54. Then, charges in the current are stored in the floating body region 36.

The capacitor-less DRAM cell further includes a first conductive line 56 positioned below and contacts the first isolating element 30, and coupling to the writing drain 34. An isolating layer 22 such as silicon nitride surrounds the first conductive line 56 and exposes a surface of the first conductive line 56 adjacent to the writing drain 34. The isolating layer 22 can also extends from the second isolating element 32 into the supporting insulating region 14. In this way, charges can be trapped in the floating body region 36.

Furthermore, a second conductive line 58 can be disposed optionally below and contacts the second isolating element 32. Similarly, the isolating layer 22 can surround the second conductive line and expose a surface of the second conductive line 58 to the writing drain 34 at the right side of the second isolating element 32. The first conductive line 56 may be made of a stack structure including a polysilicon layer 28 and a metal layer 24. The second conductive line 58 may have the same structure as the first conductive line 56. The polysilicon layer 24 may be embedded in the bottom of the semiconductor region 12. Furthermore, the polysilicon layer 24 of the first conductive line 56 couples to and besides the writing drain 34. The metal layer 24 is embedded in the supporting insulating region 14, and the interface of the metal layer 24 and the polysilicon layer 28 is lower than the interface of the floating body region 36 and the supporting insulating region 14.

The capacitor-less DRAM cell according to a preferred embodiment of the present invention has two transistors with three terminals: a source, a reading drain, and a writing drain. The writing drain is heavily-doped to induce serious impact ionization. Therefore, high writing efficiency can be achieved. The floating body region is also heavily-doped to elongate the data retention time. Furthermore, because the U-shaped channel has a long path, the off-state leakage in the capacitor-less DRAM cell is therefore alleviated.

Those skilled in the art will readily observe that numerous modifications and alterations of the device and method may be made while retaining the teachings of the invention.

What is claimed is:

1. A semiconductor memory device comprising:
   a substrate including a supporting insulating region and a semiconductor region disposed on the supporting insulating region;
   a first isolating element and a second isolating element substantially parallel to the first isolating element embedded in the semiconductor region, respectively;
   a carrier region disposed in the semiconductor region and between the first isolating element and the second isolating element;
   two source/drain regions positioned in the carrier region with an first isolating layer disposed between the two source/drain regions;
   a floating body region positioned in the carrier region underneath the two source/drain regions;
   an abrupt doping region positioned in the floating body region;
   a first gate dielectric layer positioned on a first side of the carrier region;
   a first gate positioned on the first gate dielectric layer;
   a first conductive line positioned below the first isolating element, and coupling to the abrupt doping region; and
   a second isolating layer extending from the first isolating element and the second isolating element to the supporting insulating region for isolating the floating body region.

2. The semiconductor memory device of claim 1, wherein the semiconductor memory device further comprising:
   a first channel coupling the source/drain regions.

3. The semiconductor memory device of claim 2, further comprising a second channel coupling one of the source/drain regions to the abrupt doping region.

4. The semiconductor memory device of claim 3, wherein information stored in the floating body region is formed by a current flowing in a direction from the first channel to the second channel.

5. The semiconductor memory device of claim 1, wherein the semiconductor memory device further comprising:
   a second gate dielectric layer positioned on a second side of the carrier region; and
   a second gate positioned on the second gate dielectric layer.

6. The semiconductor memory device of claim 1, wherein the first conductive line comprises a stack structure including a polysilicon layer and a metal layer.

7. The semiconductor memory device of claim 6, wherein the polysilicon layer is embedded in the bottom of the semiconductor region, and the metal layer is embedded in the supporting insulating region.

8. The semiconductor memory device of claim 1, wherein the isolating layer surrounds the first conductive line, and exposing a surface of the first conductive line adjacent to the first abrupt doping region.

9. The semiconductor memory device of claim 1, further comprising a second conductive line positioned below the second isolating element.

10. The semiconductor memory device of claim 1, wherein the second isolating layer surrounds the second conductive line.

11. The semiconductor memory device of claim 1, wherein the source/drain doping regions and the abrupt doping region are of a first conductivity type.

12. The semiconductor memory device of claim 1, wherein the floating body is of a second conductivity type.

13. A semiconductor memory device comprising:
   a substrate including a supporting insulating region and a semiconductor region disposed on the supporting insulating region;
   a plurality of isolations embedded in the semiconductor region and defining a plurality of active areas, wherein at least one of the active areas comprises:
      a first isolating element and a second isolating element substantially parallel to the first isolating element embedded respectively in the semiconductor region in the at least one active area;
      a carrier region disposed in the semiconductor region in the at least one active area and between the first isolating element and the second isolating element;
      a dual-transistor memory cell disposed in the at least one active area, the dual-transistor memory cell comprising:
         a recess channel transistor comprising a source disposed in a main surface of the carrier region; a reading drain disposed in the main surface of the carrier region being spaced apart from the source; a first isolating layer between the source and the reading drain; and a U-shaped channel at the bottom of the first isolating layer between the source and the reading drain; and
         a vertical transistor comprising the source disposed in the main surface of the carrier region; a writing drain disposed in the carrier region underneath the source; and
         a vertical channel between the source and the writing drain;
         a first gate disposed at a first side of the carrier region;
         a first gate dielectric layer between the first gate and the carrier region;
         a second gate disposed at a second side of the carrier region; and a second gate dielectric layer between the second gate and the carrier region;

a first conductive line positioned below the first isolating element, and coupling to the writing drain; and a second isolating layer extending from the first isolating element and the second isolating element to the supporting insulating region.

14. The semiconductor memory device of claim 13, further comprising a second conductive line positioned below the second isolating element.

15. The semiconductor memory device of claim 14, wherein the second isolating layer surrounds the second node.

16. The semiconductor memory device of claim 13, wherein the second isolating layer surrounds the first conductive line and exposing a surface of the first conductive line to the writing drain.

17. A semiconductor memory device comprising:

a substrate including a supporting region and a semiconductor region disposed on the supporting insulating region;

a first trench and a second trench located in the semiconductor region and the supporting insulating region respectively;

two source/drain regions located in the semiconductor region between the first trench and the second trench;

a first isolating layer located on the surface of the first trench;

a first conductive line located inside and on the first isolating layer, wherein a portion of the first conductive line contacts the semiconductor region;

an abrupt doping region located in the semiconductor region and adjacent to the first conductive line;

a first gate dielectric layer located on a first side of the semiconductor region;

a first gate located on the first gate dielectric layer; and a second isolating layer located on the surface of the second trench.

18. The semiconductor memory device of claim 17, wherein the semiconductor memory device further comprises:

a second gate dielectric layer located on a second side of the semiconductor region and a second gate located on the second gate dielectric layer.

19. The semiconductor memory device of claim 17, wherein the first isolating layer comprises:

a first isolating element located on the first conductive line.

20. The semiconductor memory device of claim 19, wherein the second isolating layer comprises:

a second isolating element located on a second conductive line located at an upper part of the second trench.

* * * * *